US010276364B2

(12) United States Patent
Su et al.

(10) Patent No.: US 10,276,364 B2
(45) Date of Patent: Apr. 30, 2019

(54) BEVEL ETCH PROFILE CONTROL

(71) Applicant: Applied Materials, Inc., Santa Clara, CA (US)

(72) Inventors: Zonghui Su, San Jose, CA (US); Vinay Prabhakar, Cupertino, CA (US); Abdul Aziz Khaja, San Jose, CA (US); Jeongmin Lee, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/654,444

(22) Filed: Jul. 19, 2017

(65) Prior Publication Data

US 2018/0323062 A1    Nov. 8, 2018

Related U.S. Application Data

(60) Provisional application No. 62/503,193, filed on May 8, 2017.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/02* | (2006.01) |
| *H01L 21/3065* | (2006.01) |

(Continued)

(52) U.S. Cl.
CPC ...... *H01L 21/02087* (2013.01); *B08B 7/0035* (2013.01); *H01J 37/3244* (2013.01); *H01J 37/32715* (2013.01); *H01L 21/3065* (2013.01); *H01L 21/67069* (2013.01); *H01J 37/32357* (2013.01); *H01J 2237/334* (2013.01)

(58) Field of Classification Search
CPC ............... H01L 21/02087; H01J 37/32642
See application file for complete search history.

(56) References Cited

U.S. PATENT DOCUMENTS

| | | |
|---|---|---|
| 5,994,678 A | 11/1999 | Zhao et al. |
| 6,364,949 B1 | 4/2002 | Or et al. |

(Continued)

FOREIGN PATENT DOCUMENTS

JP    2006120876 A    5/2006

OTHER PUBLICATIONS

PCT/US2018/031311, International Search Report dated Aug. 31, 2018, 13 pages.

*Primary Examiner* — Thomas T Pham
(74) *Attorney, Agent, or Firm* — Patterson + Sheridan LLP

(57) ABSTRACT

Implementations described herein generally relate to methods and apparatus for processing a substrate. More particularly, implementations described herein relate to methods and an apparatus for bevel etch processing. In one embodiment, a method of cleaning a bevel edge of a semiconductor substrate is provided. The method includes placing a substrate on a cover plate inside of a processing chamber, the substrate having a deposition layer, which includes a center, and a bevel edge. A mask is placed over the substrate. The edge ring is disposed around/under the substrate. The method also includes flowing a process gas mixture adjacent the bevel edge, and flowing a purge gas through a first hole, a second hole, and a third hole of the mask in the center of the substrate adjacent a top of the substrate.

20 Claims, 3 Drawing Sheets

(51) Int. Cl.
  *B08B 7/00* (2006.01)
  *H01J 37/32* (2006.01)
  *H01L 21/67* (2006.01)

(56) References Cited

U.S. PATENT DOCUMENTS

| | | |
|---|---|---|
| 8,371,567 B2 | 2/2013 | Angelov et al. |
| 2007/0158305 A1 | 7/2007 | Cooke et al. |
| 2011/0146703 A1* | 6/2011 | Chen .................. C23C 16/0245 |
| | | 134/1.1 |
| 2011/0232566 A1 | 9/2011 | Chen et al. |
| 2012/0074099 A1 | 3/2012 | Fang et al. |
| 2015/0099365 A1* | 4/2015 | Chen ................. H01J 37/32091 |
| | | 438/710 |
| 2015/0376780 A1 | 12/2015 | Khaja et al. |

\* cited by examiner

BEVEL ETCH PROFILE CONTROL

CROSS-REFERENCE TO RELATED APPLICATIONS

This application claims benefit of U.S. provisional patent application Ser. No. 62/503,193, filed May 8, 2017, which is herein incorporated by reference.

BACKGROUND OF THE DISCLOSURE

Field of the Disclosure

Implementations described herein generally relate to methods and apparatus for processing a substrate. More particularly, implementations described herein relate to methods and an apparatus for bevel etch processing.

Description of the Related Art

Plasma processing is commonly used for many semiconductor fabrication processes for manufacturing integrated circuits, flat-panel displays, magnetic media, and other devices. A plasma, or ionized gas, is generated inside a remote plasma source (RPS) and flows into a processing chamber and then applied to a workpiece to accomplish a process such as deposition, etching, or implantation. Processing is generally accomplished by introducing a precursor gas or gas mixture into a vacuum chamber that contains a substrate. During the deposition or etching processes, a component, such as a mask or showerhead, may be located opposite the substrate. The precursor gas or gas mixture in the chamber is energized (e.g., excited) into a plasma by using a RPS. The excited gas or gas mixture reacts to selectively etch a layer of film on an edge of the substrate.

However, the beveled edges of the substrate, such as sides and corners thereof, experience conditions that may be different than the conditions experienced at other portions of the substrate. These different conditions affect processing parameters such as film thickness, etch uniformity, and/or film stress. The difference of etch rate and/or film property, such as film thickness or stress, between the center and the edges of the substrate becomes significant and may result in devices with suboptimal characteristics.

Therefore, what is needed in the art is an improved method and apparatus for bevel etch processing.

SUMMARY OF THE DISCLOSURE

Implementations described herein generally relate to methods and apparatus for processing a substrate. More particularly, implementations described herein relate to methods and an apparatus for bevel etch processing. The method includes placing a substrate on a substrate support inside of a processing chamber, the substrate having a deposition layer, which includes a center, and a bevel edge. A mask is placed over the substrate. The edge ring is disposed around the substrate and on a substrate support. The method also includes flowing a process gas mixture to etch adjacent the bevel edge, and flowing a purge gas through a first hole, a second hole, and a third hole of the mask in the center of the substrate adjacent a top of the substrate.

In another implementation, a method includes placing a substrate on a substrate support inside of a processing chamber, the substrate having a deposition layer, which includes a center, and a bevel edge. A mask is placed over the substrate. The edge ring is disposed under the substrate and on a substrate support. The method also includes raising the edge ring to contact the mask. The method also includes flowing a process gas mixture adjacent the bevel edge, and flowing a purge gas through a first hole, a second hole, and a third hole of the mask in the center of the substrate adjacent a top of the substrate.

In another implementation, a method includes placing a substrate on a substrate support inside of a processing chamber, the substrate having a deposition layer, which includes a center, and a bevel edge. A mask is placed over the substrate. The edge ring is disposed around the substrate and on a substrate support. The method also includes flowing a process gas mixture adjacent the bevel edge, and flowing a purge gas through a first hole, a second hole, and a third hole of the mask in the center of the substrate adjacent a top of the substrate. The process gas includes one of $N_2$, $O_2$, $NF_3$, Ar, or He.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Implementations described herein generally relate to methods and apparatus for processing a substrate. More particularly, implementations described herein relate to methods and an apparatus for bevel etch processing. In one embodiment, a method of cleaning a bevel edge of a semiconductor substrate is provided. The method includes placing a substrate on a cover plate inside of a processing chamber, the substrate having a deposition layer, which includes a center, and a bevel edge. A mask is placed over the substrate. The edge ring is disposed around/under the substrate. The method also includes flowing a process gas mixture adjacent the bevel edge, and flowing a purge gas through a first hole, a second hole, and a third hole of the mask in the center of the substrate adjacent a top of the substrate.

Figure 1:
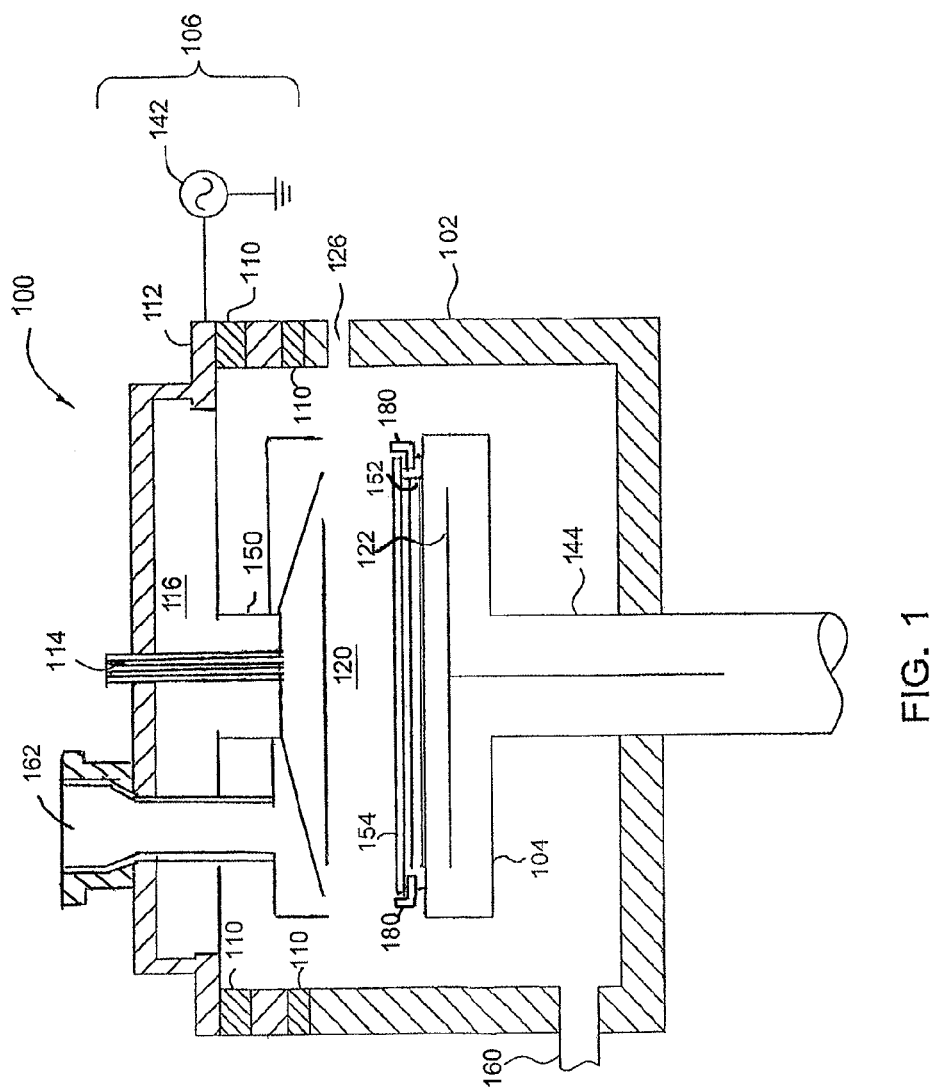
FIG. 1 illustrates a schematic cross sectional diagram of a processing chamber 100, according to one aspect of the disclosure.

FIG. 1 illustrates a schematic cross sectional diagram of a processing chamber 100, according to one aspect of the disclosure. As shown, the processing chamber 100 is an etch chamber suitable for etching a substrate, such as substrate 154. Examples of processing chambers that may be adapted to benefit from exemplary aspects of the disclosure are Producer® Processing Chamber, and Precision™ Processing Chamber, commercially available from Applied Materials, Inc., located in Santa Clara, Calif. It is contemplated that other processing chambers, including those from other manufacturers, may be adapted to benefit from aspects of the disclosure.

The processing chamber 100 may be used for various plasma processes. In one aspect, the processing chamber 100 may be used to perform dry etching with one or more etching agents. For example, the processing chamber may be used for ignition of plasma from a precursor $C_xF_y$ (where x and y represent known compounds), $O_2$, $NF_3$, N2, or combinations thereof. In another implementation the processing chamber 100 may be used for plasma enhanced chemical vapor deposition with one or more chemical agents.

The processing chamber 100 includes a chamber body 102, a lid assembly 106, a support assembly 104, and a gas outlet 160. The lid assembly 106 is positioned at an upper end of the chamber body 102. The lid assembly 106 and support assembly 104 of FIG. 1 may be used with any processing chamber for plasma or thermal processing. Chambers from other manufacturers may also be used with the components described above. The support assembly 104 is disposed inside the chamber body 102, and a lid assembly 106 coupled to the chamber body 102 and enclosing the support assembly 104 in a processing volume 120. The chamber body 102 includes a slit valve opening 126 formed in a sidewall thereof. The slit valve opening 126 is selectively opened and closed to allow access to the interior volume 120 by a substrate handling robot (not shown) for substrate transfer.

An isolator 110, which may be a dielectric material such as a ceramic or metal oxide, for example aluminum oxide and/or aluminum nitride, contacts the electrode and separates the electrode electrically and thermally from a gas distributor 112 and from the chamber body 102. The gas distributor 112 features openings for admitting process gas into the processing volume 120. The process gases may be supplied to the processing chamber 100 via a conduit 114, and the process gases may enter a gas mixing region 116 prior to flowing through the openings to the substrate 154. The gas distributor 112 may be connected to a RPS.

The support assembly 104 may be any suitable substrate support, such as a vacuum chuck, an electrostatic chuck, or a heated pedestal. In one implementation the substrate support is a "L" shaped pedestal to save space for load lock installation. The support assembly has a vacuum chuck line, a heating line and a TC that probes support assembly temperature. In one implementation, the substrate support 104 is configured to support the substrate 154 for processing. The lift mechanism allows the substrate support 104 to be moved vertically within the chamber body 102 between a lower transfer position and a number of raised process positions. The support assembly 104 may be formed from a metallic or ceramic material, for example a metal oxide or nitride or oxide/nitride mixture such as aluminum, aluminum oxide, aluminum nitride, or an aluminum oxide/nitride mixture. A heater 122 may be coupled to the support assembly 104. The heater 122 may be embedded within the support assembly 104 or coupled to a surface of the support assembly 104. The heater 122 may be coupled to a power source extending exterior the chamber 100.

Figure 2:
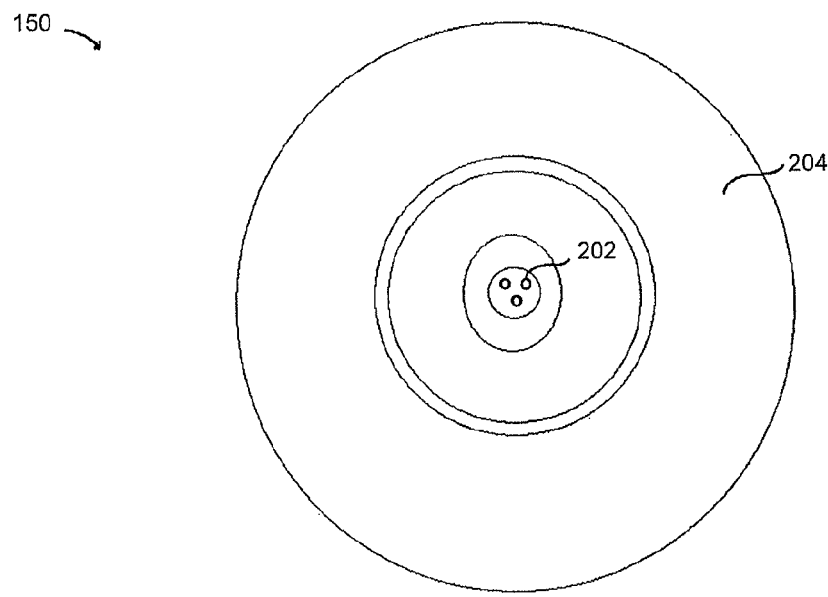
FIG. 2 illustrates a schematic bottom view of a mask utilized in the chamber of FIG. 1, according to one aspect of the disclosure.

A reactant blocker or mask 150 may be part of the lid assembly 106, or may be a separate detachable piece. The mask 150 has a dome shape body 204 with a flattened bottom surface. As shown in FIG. 2, the mask 150 has circular aperture. At the center of the aperture are three openings 202 to create a small choke ensuring uniform distribution of purge gas in all directions. In one implementation, the three openings 202 may be of uniform size and shape and spaced equidistant. The mask 150 may be lowered to contact a substrate 154. The mask 150 may be quartz or other ceramic material, and may be coated with Ni or NiO, if desired, or a chemically resistant or plasma resistant material, such as yttria or yttria oxide, in some embodiments. The lid assembly 106 further includes a plasma source 162. The plasma source 162 is adjacent the mask 150.

Figure 3:
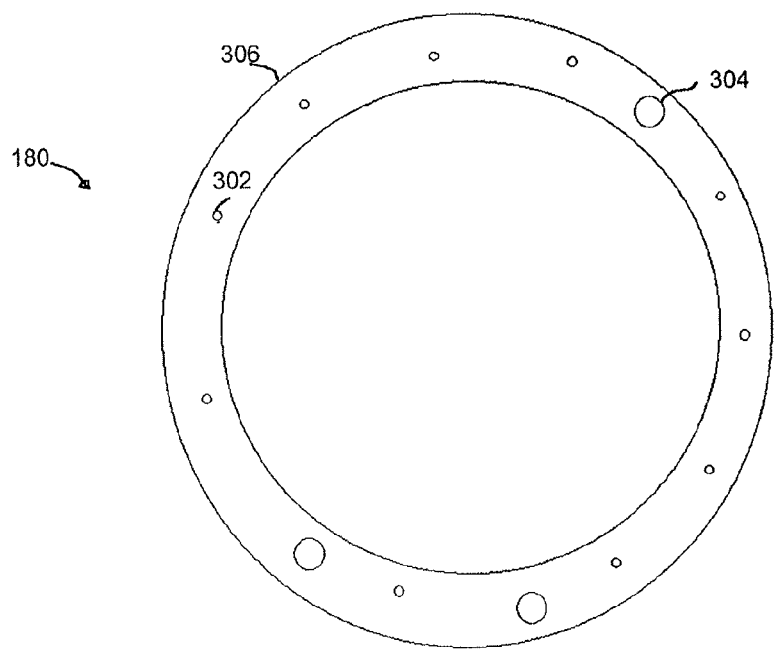
FIG. 3 illustrates a schematic bottom view of an edge ring utilized in the chamber of FIG. 1, according to one aspect of the disclosure.

FIG. 3 illustrates a schematic top view of an edge ring 180 utilized in the chamber of FIG. 1, according to one aspect of the disclosure. In one embodiment, the edge ring 180 is disposed adjacent to the contact mask 150. The edge ring 180 has an annular body 306. The edge ring 180 includes several openings 304 for engaging the substrate assembly 104. The edge ring 180 is disposed on the substrate assembly 104. In one implementation, the edge ring 180 may be disposed adjacent to a cover plate 152. The edge ring 180 may comprise a ceramic material, such as quartz or alumina. The edge ring 180 has a plurality of protrusions 302. The protrusions 302 may be circular bumps, square, rectangular, hexagonal, or any other shape. The protrusions 302 are arranged around the body 306. Ten protrusions 302 are shown, however, there may be more or less protrusions 302. The protrusions may be equally spaced around the circumference of the body 306 of the edge ring 180. In one implementation, the protrusions 302 reduce heat transfer from the substrate assembly 104 and the substrate 154. Additionally, the edge ring 180 provides a pressure differential between the top of the substrate and the bottom of the substrate 154. In one implementation, the edge ring 180 provides for a uniform leveling above the substrate 154.

Figure 4:
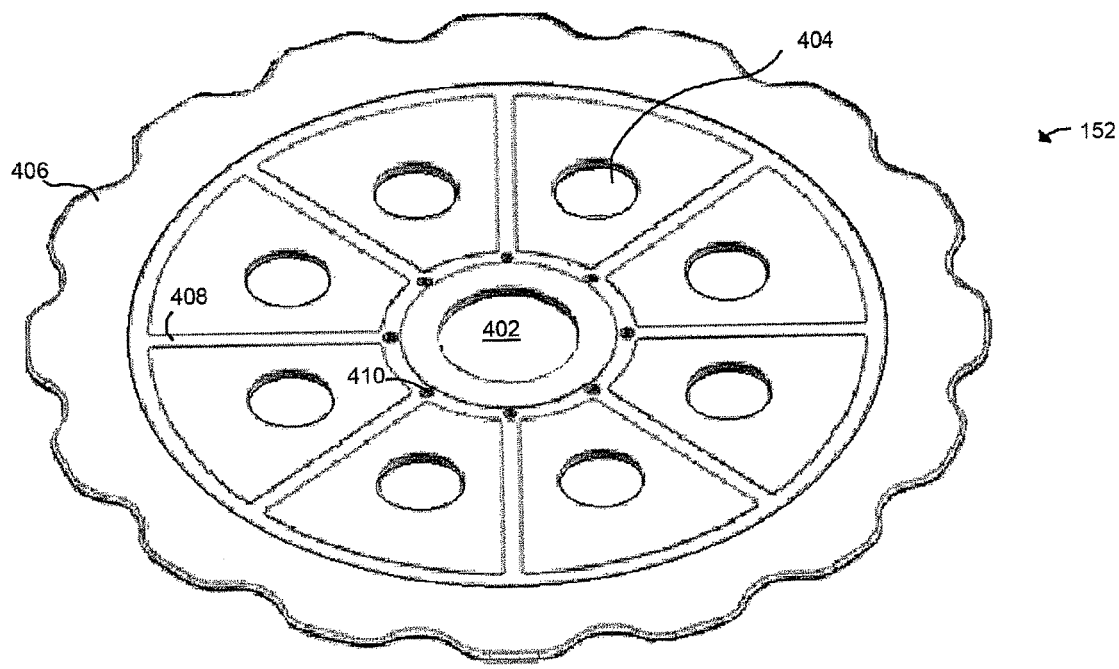
FIG. 4 illustrates a schematic top view of a cover plate utilized in the chamber of FIG. 1, according to one aspect of the disclosure.

FIG. 4 illustrates a schematic top view of a cover plate 152 utilized in the chamber of FIG. 1, according to one aspect of the disclosure. The cover plate 152 includes a central aperture 402, a plurality of openings 404, a plurality of fasteners 410, a scalloped edge 406, and a plurality of spokes 408. The central aperture 402 may be a circular opening, a hexagonal opening, a rectangular opening, or any other shaped opening. The plurality of openings 404 are circular openings displaced circumferentially around the central aperture 402. Each of the plurality of openings 404 are smaller than the central aperture 402. Although the present disclosure shows eight openings 404, the plurality of openings 404 can include more or less than eight openings 404. In one implementation, the openings 404 are evenly spaced around the central aperture 402. In another implementation, the distances between the openings 404 are varied. The plurality of spokes 408 are grooves in the cover plate 152. The plurality of spokes 408 radiate out from a circular groove that encircles the central aperture 402. The plurality of spokes 408 are linear grooves that extend radially outward towards the scalloped edge 406. The scalloped edge 406 includes a wave-like pattern with uniform indentions. The scalloped edge 406 may have rounded edges, square edges, or pointed edges. The scalloped edge 406 prevents substrate sliding when placing onto the cover plate 152 and chuck ring 180.

In operation, a method of etching a substrate begins by placing a substrate on a substrate support inside of a processing chamber. After undergoing a deposition process in the same chamber or in a different chamber, the substrate has a dielectric layer, a center, and a bevel edge. The mask 150 is lowered over the substrate 154 to maintain a small gap between a mask and a substrate between 0.003 inch and 0.100 inch. In one implementation the substrate 154 and the edge ring 180 are raised to contact the mask 150. In one implementation, the distance between the substrate 154 and the mask 150 is less than 100 mil. In one implementation, the distance between the substrate 154 and the mask 150 is about 10 mil. In another implementation, the distance between the substrate 154 and the mask 150 is less than 100 mil, such as between 5 mil and 20 mil. The edge ring 180 is disposed around/under the substrate 154. In another implementation, the edge ring 180 is disposed around the cover plate 152. In another implementation, the edge ring 180 is disposed over the substrate assembly 104. The method continues by flowing a process gas mixture adjacent a top of the substrate 154 and adjacent the bevel edge. The process gas may be any number of etchant gases. The process gas etches the bevel edge. The process gas may include $N_2$, $O_2$, $Nf_3$, Ar, He, or any combination thereof. The method further includes flowing a purge gas through the three openings 202 of the mask 150 about the center of the substrate 154.

By flowing the etchant gas at a first location and the purge gas at a second location, a more uniform and controlled etch can be achieved. Additionally, the various openings in the mask create a small flow choke and ensure uniform distribution of the purge gas in all directions. Finally, the scalloped cover plate provides stability during substrate placement and pick up.

While the foregoing is directed to embodiments of the present invention, other and further embodiments of the invention may be devised without departing from the basic scope thereof, and the scope thereof is determined by the claims that follow.

The invention claimed is:

1. A method comprising:
placing a substrate on a cover plate inside of a processing chamber, the substrate having a dielectric layer, a center, and a bevel edge, wherein the processing chamber comprises a mask disposed above the substrate and an edge ring disposed under the substrate, and wherein the edge ring has an annular body;
raising the edge ring to contact the mask;
flowing a process gas comprising an etchant along an outer surface of the mask and to the bevel edge, wherein the process gas is ignited to produce a plasma;
exposing an upper surface of the substrate at the bevel edge to the process gas; and
flowing a purge gas from two or more holes positioned on an inner surface of the mask to the center of the substrate and adjacent a top of the substrate.

2. The method of claim 1, wherein the cover plate is disposed on a substrate support.

3. The method of claim 1, wherein the cover plate has scalloped edges.

4. The method of claim 1, wherein the cover plate has a central aperture and a plurality of openings surrounding the central aperture.

5. The method of claim 1, wherein the plasma is produced by a plasma source adjacent the mask.

6. The method of claim 1, wherein the distance between the substrate and the mask is less than 100 mil.

7. The method of claim 1, wherein the process gas comprises $N_2$, $O_2$, $NF_3$, Ar, He, or any combination thereof.

8. A method comprising:
placing a substrate on a cover plate inside of a processing chamber, the substrate having a dielectric layer, a center, and a bevel edge, wherein the processing chamber comprises a mask disposed above the substrate and an edge ring disposed under the substrate;
raising the edge ring to contact the mask;
flowing a process gas comprising an etchant along an outer surface of the mask and to the bevel edge, wherein the process gas is ignited to produce a plasma;
exposing an upper surface of the substrate at the bevel edge to the process gas; and
flowing a purge gas from two or more holes positioned on an inner surface of the mask to the center of the substrate and adjacent a top of the substrate.

9. The method of claim 8, wherein the cover plate is disposed on a substrate support.

10. The method of claim 8, wherein the cover plate has scalloped edges.

11. The method of claim 8, wherein the cover plate has a central aperture and a plurality of openings surrounding the central aperture.

12. The method of claim 8, wherein the plasma is produced by a plasma source adjacent the mask.

13. The method of claim 8, wherein the distance between the substrate and the mask is less than 100 mil.

14. The method of claim 8, wherein the process gas comprises $N_2$, $O_2$, $NF_3$, Ar, He, or any combination thereof.

15. A method comprising:
placing a substrate on a cover plate inside of a processing chamber, the substrate has a center and a bevel edge and comprises a dielectric layer thereon, wherein the processing chamber comprises a mask disposed above the substrate and an edge ring disposed under the substrate, and wherein the edge ring comprises a ceramic material;
raising the edge ring to contact the mask;
flowing a process gas along an outer surface of the mask and to the bevel edge, wherein the process gas comprises $N_2$, $O_2$, $NF_3$, Ar, He, or any combination thereof, and wherein the process gas is ignited to produce a plasma;
exposing an upper surface of the substrate at the bevel edge to the process gas and etching the dielectric layer; and
flowing a purge gas from two or more holes positioned on an inner surface of the mask to the center of the substrate and adjacent a top of the substrate.

16. The method of claim 15, wherein the cover plate is disposed on a substrate support.

17. The method of claim 15, wherein the cover plate has scalloped edges.

18. The method of claim 15, wherein the cover plate has a central aperture and a plurality of openings surrounding the central aperture.

19. The method of claim 15, wherein the plasma is produced by a plasma source adjacent the mask.

20. The method of claim 15, wherein the distance between the substrate and the mask is less than 100 mil.

* * * * *